United States Patent [19]

Sueoka et al.

[11] 4,170,020

[45] Oct. 2, 1979

[54] GATE TURN-OFF THYRISTOR FOR REDUCING THE ON CURRENT THEREOF

[75] Inventors: Tetsuro Sueoka, Tokyo; Hisao Udagawa, Hatano, both of Japan

[73] Assignees: Kabushiki Kaisha Meidensha, Tokyo; International Rectifier Corporation, Japan Ltd., Hatano, both of Japan

[21] Appl. No.: 784,642

[22] Filed: Apr. 4, 1977

[30] Foreign Application Priority Data

Apr. 9, 1976 [JP] Japan ................................. 51-86052

[51] Int. Cl.$^2$ ............................................. H01L 29/74
[52] U.S. Cl. ........................................ 357/38; 357/36; 357/51; 357/55
[58] Field of Search ...................... 357/38, 39, 55, 51, 357/36

[56] References Cited

U.S. PATENT DOCUMENTS

| 4,012,761 | 3/1977 | Ferro et al. | 357/38 |
| 4,092,703 | 5/1978 | Sueoka et al. | 357/38 |

*Primary Examiner*—Joseph E. Clawson, Jr.
*Attorney, Agent, or Firm*—Haseltine, Lake & Waters

[57] ABSTRACT

The invention discloses a gate controlled semiconductor device in which a gate electrode is substantially divided into many pieces. And the semiconductor device comprises a semiconductive element having at least one P-N junction formed by at least a pair of P-type diffusion regions and N-type diffusion regions, a cathode assembly including a metallic layer deposited on a cathode-emitter layer formed on a surface of said semiconductive element, an anode electrode assembly and gate electrode assemblies which includes a plural separated metallic layers provided around the cathode electrode assemblies of the cathode-emitter layer.

5 Claims, 12 Drawing Figures

GATE TURN-OFF THYRISTOR FOR REDUCING THE ON CURRENT THEREOF

BACKGROUND OF THE INVENTION

The present invention relates to a semiconductor device, and more particularly to a gate controlled semiconductor device which is turned on and off by applying a gate control signal thereto.

A gate control semiconductor device such as, for example, a gate turn-off thyristor is constructed same as a usual reverse-blocking three-terminal thyristor. The gate turn-off thyristor is transmitted from a conductive state to a non-conductive state by supplying the current to a gate electrode thereof, and thereby the main current flows into the gate turn-off thyristor. In order to change the thyristor to the non-conductive state from the conductive state, the main current must be made zero during some predetermined interval by means of some external means. The gate turn-off thyristor may be returned to the non-conductive state from the conductive state by supplying the negative current which is the current flowing to the reverse current for reverse-biassing a cathode junction. A ratio of a value of the reverse current add that of the main current (a load current) which is turned off by the reverse current is called a turned-off gain ($g = I/Ig$), where I is the main current of the turn-off thyristor, and Ig is the reverse current. In order to increase the turn-off gain of the gate turn-off thyristor, it is necessary to make the base width to large and/or to make a gold diffusion condition to strong. The more important thing is a configulation of a cathode electrode which is required to make a tranverse resistance between a cathode electrode and a gate electrode to small as can be possible, in order to sweep effectively the current of the cathode.

In conventional gate turn-off thyristor, the current mu-factor is restricted to lower longitudinally than that of the usual thyristor in order to increase the current interrupting capability of the gate electrode, and the gate turn-off thyristor is designed in shape so that the cathode electrode is located near the gate electrode as can be possible, in order to eliminate the inner impedance between the cathode electrode and the gate electrode. Accordingly, the cathode electrode is divided into many small pieces and, as a result, the length of opposing faces of the cathode electrode and the gate electrode become innevitably long and, in particular, the cathode junction of a large capacity gate turn-off thyristor is divided into many number of small pieces. Accordingly, in a gate turn-off thyristor constructed above, the gating current is necessary more than ten times and/or one hundred times gating current than that of the usual power thyristor.

In general, the gate turn off thyristor is often used to an inverter apparatus and a chopper apparatus, and when a motor is used as a load of the apparatus employing the gate turn-off thyristor, the gating current must be supplied continuously to the gate electrode of the gate turn-off thyristor not only conductive internal but also nonconductive interval thereof. This requision is more serious in the gate turn-off thyristor than the usual thyristor. In the gate turn-off thyristor, the main current is interrupted due to the change of the load current even when the gate turn-off thyristor has been turned on, and then holds the current by a part of the cathode assembly. In this case, the long time interval is required to expand the conduction area since the cathode electrode is formed by the many pieces, and thereby the current concentration becomes large in part of the cathode electrode. In these conditions, when the gate turn-off thyristor is turned off, the off operation of the gate turn-off thyristor is decreased and the gate turn-off thyristor is destroyed permanently. Particularly, in the gate turn-off thyristor having many separated emitter-cathodes, only in part of the cathode holds the current and the conductive area is not expands and to other separated emitters, and as a result the gate turn-off thyristor is destroyed.

In this like manner, the gate turn-off thyristor requires not only many times gating current more than the usual current in firing, but also is required to supplies the large gating current all conduction interval thereof. On the other hand, to improve the gating sensitivity a thyristor having an amplificating function is proposed. The amplificating function, however, operates only when the thyristor is fired. Consequently, it is strongly requested to improve the gating sensitivity of the gate turn-off thyristor.

SUMMARY OF THE INVENTION

Accordingly, an object of the invention is to provide a high performance gate controlled semiconductor device in which an ON sensitivity is improved by dividing a gate electrode into many pieces to be located arround a cathode-emitter layer and by using one of the gate electrodes for making the device to turn ON.

Further object of the invention is to provide a high performance gate controlled semiconductor device in which the necessary gate current to fire the device is eliminated without decreasing the characteristics in turning OFF.

Another object of the invention is to provide a gate controlled semiconductor device which is able to render a gate driver circuit to be small and to be simple construction in addition to being inexpensive by decreasing the consuming power for a gate signal.

Still another object of the invention is the provision of a gate turn-off thyristor of which the conductive state may be maintained by the small gate power.

With above in view, the present invention resides in that a gate controlled semiconductor device comprises a semiconductive element having at least one P-N junction formed by at least a pair of P-type diffusion region and N-type diffusion region, a cathode assembly including a metallic layer deposited on a cathode-emitter layer formed on a surface of said semiconductive element, an anode electrode assembly and gate electrode assemblies which includes a plural separated metallic layers provided arround the cathode electrode assembly of said cathode-emitter layer.

A variety of embodiments will be described hereinafter including ones in which resistor layers and an auxiliary thyristor are integrated.

BRIEF DESCRIPTION OF THE DRAWINGS

The invention will be described more fully with reference to the drawing in which.

DESCRIPTION OF THE PREFERRED EMBODIMENTS

Figure 1:
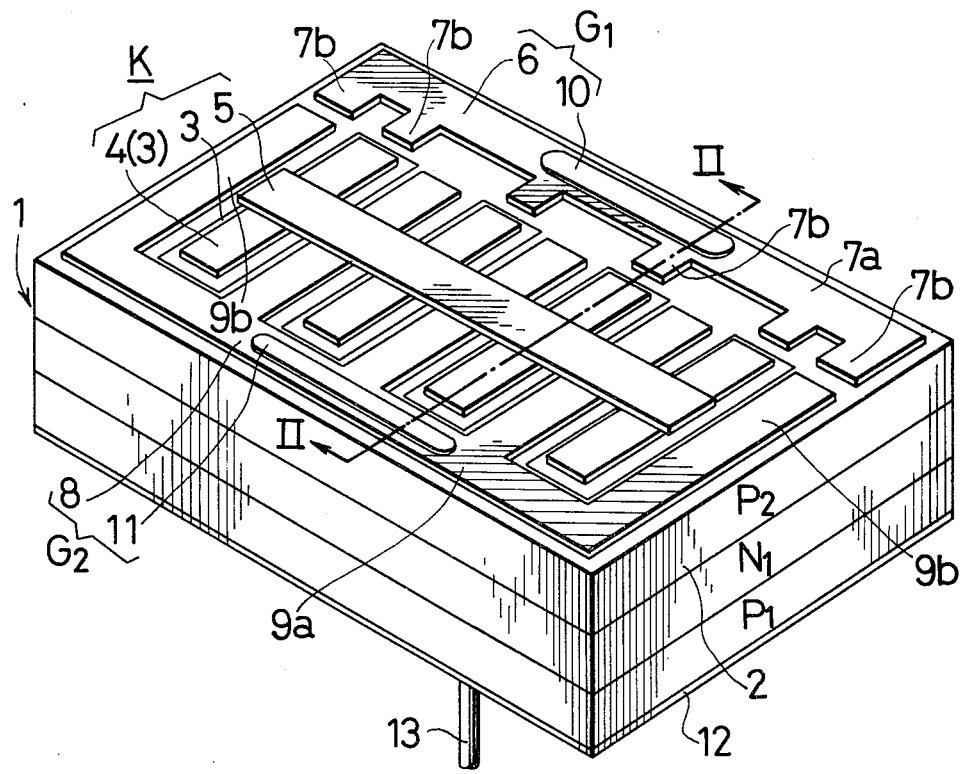
FIG. 1 is an enlarged schematic perspective view of a gate controlled semiconductor device employed in the present invention.

With reference now to the drawing, in a gate controlled semiconductive device, a semiconductive element 1, the bulk of which is weakly N-type, also includes a P1 layer which is a P-type diffused region, an N1 layer bulk, a P2 layer 2 diffused to a P-type region and a plurality of N2 layers 3 which are N-type diffused regions, spaced, localized surface zones. Metallic layers 4 are provided on each surfaces of the N2 layers 3. A drain terminal electrode 5 is commonly connected to the all metallic layers 4. A cathode electrode assembly K comprises the metallic layers 4 and the terminal electrode 5.

Two comb-shaped metallic layers 6 and 8 are arranged on a surface of P2 layer 2 which is located arround each N2 layers 3. The metallic layer 6 consists of a bridging segment 7a spaced from one end portion of each metallic layer 4 and a plurality of progections 7b extending toward the metallic layers 4. The metallic layer 8 consists of a bridging segment 9a spaced from the other end of each metallic layer 4 and a plurality of relatively thin extensions 9b which are extending from the bridging segment 9a toward the segment 7a along to the N2 layers 3. A terminal electrode 10 is connected to the bridging segment 7a of the metallic layers 6 and a terminal electrode 11 is desposed on the bridging segment 9a of the metallic layer 8. A first gate electrode assembly G1 is comprised by the metallic layer 6 and the terminal electrode 10, and a second gate electrode assembly G2 is formed by the metallic layer 8 and the terminal electrode 11.

As is best shown in FIG. 1, a gate electrode member surrounds the cathode electrode assembly K, and is devided into two sections that are the first electrode assembly G1 and the second electrode assembly G2. A metallic layer 12 is provided on the surface of the P1 layer and a lead 13 is connected to the metallic layer 12. An anode electrode assembly A is formed by the metallic layer 12 and the lead 13.

A device of the kind described above was made essentially as follows.

First, there was prepared a weakly N-type silicon wafer. Thereafter, P1 and P2 layers was grown over the each end surface of the wafer by diffusing a gallium. And, thereafter, a cathode layer N2 is formed by diffusing N-type layer in a given depth. Further, an aluminum layer is evaporated to form an ohmic electrode.

In operation, an ON signal is supplied from the first gate electrode assembly G1 and, on other hand an OFF signal is supplied from the second gate assembly G2. In turning off the semiconductive element 1, the element 1 is sweeped from both gate electrode assemblies G1 and G2. Accordingly, when the ON signal is supplied to toward the cathode electrode assembly K from the first gate terminal G1, the gate current flows to the P2 layer 2, the N1 layer, the cathode layer N2 layer 2 and the second gate electrode assembly G2. The gate current causes a portion of the N2 layer 3 in the side of the second gate electrode G2 turn on, and thereafter the main current begins to flow from the anode electrode assembly A to the cathode electrode assembly K. By flowing of the main current, the conducting region of the N2 layer 3 develops to all region of the N2 layer 3 from the second gate electrode assembly side of the N2 layer 3.

In case of turning off the main current, the whole region of the N2 layers 3 may be reset to the OFF state by sweeping the current from the gate electrode assembly $G_2$, and thereby the main current is turned OFF.

For better understanding the present invention, the characteristics of the gate turn-off thyristor will be described with reference to FIGS. 3 to 5.

Figure 3:
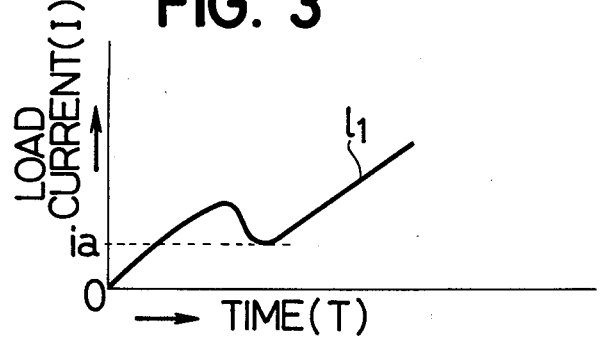
FIG. 3 is a curve showing a load current characteristics of a general gate controlled semiconductor device.
Figure 4:
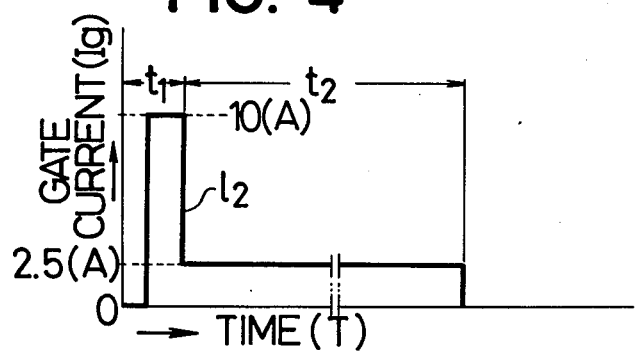
FIG. 4 is a graph showing a gate current characteristics of a conventional gate turn-off thyristor.
Figure 5:
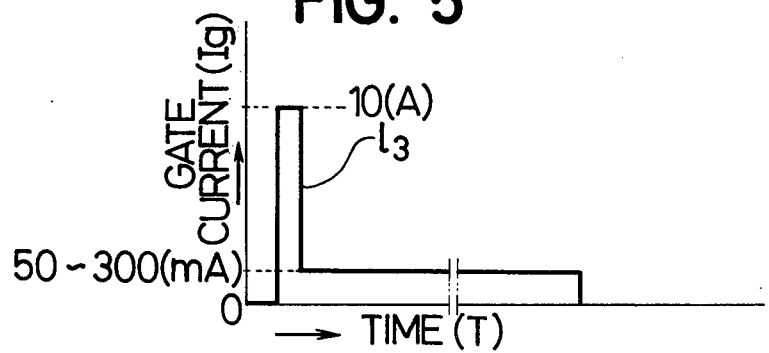
FIG. 5 is a graph illustrating a gate current characteristics of a gate turn-off thyristor shown in FIGS. 1 and 2.

FIGS. 3 to 5 show the characteristics of the gate turn-off thyristors, and, in general, when the controllable current of the gate turn-off thyristor is increased by increasing the opposing length of the gate electrode and the cathode electrode, the gate current Ig increases as is shown by a curve 12 in FIG. 4.

Particularly, when the load of the apparatus which employs the gate turn-off thyristor is inductive, the load current I fluctuates as is shown by a curve 11 in FIG. 3, and therefore when the load current value at point a approaches to the holding current value of the gate turn-off thyristor, a part of the separated cathode-gate layer turns OFF and, as a result, a portion of the cathode-emitter layer becomes conductive and the other portion becomes nonconductive. To prevent this condition, the gate current must be fully supplied in order to maintain the conductive state of all cathodes. More specifically, in one example of the gate turn-off thyristor, a gate current of 10 amperes must be supplied during a time interval t1 (such as more than 10 $\mu$S) immediately after the commencement of firing of the gate turn-off thyristor, and thereafter a gate current of 2.5 amperes must be successively supplied during a time interval t2 (such as more than 100 $\mu$S). Accordingly, a gate driver circuit of the gate turn-of thyristor becomes large and complex construction.

Figure 2:
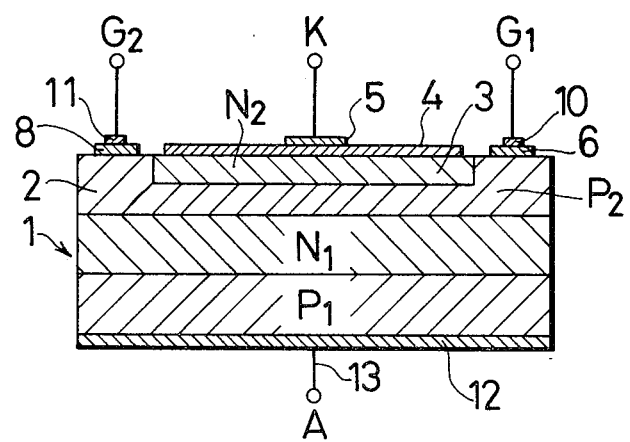
FIG. 2 is a vertical sectional view of the gate controlled semiconductor device taken along line II—II of FIG. 1.

On the contrary, in the gate turn-off thyristor shown in FIGS. 1 and 2, which employs the present invention, since the opposing length of the first gate electrode assembly G1 is made short in comparison with that of the second electrode assembly G2, the necessary gate current is extremely decreased as shown in FIG. 5. More specifically, as is best shown by a curve 13 in FIG. 5, a firing current of 10 amperes must be supplied to the element 1 from the second gate electrode G2 during the time interval t1 immediately after the gate turn-off thyristor has been turned ON, and thereafter a gate current of 50-300 milliamperes must be supplied to the element 1 from the first gate electrode assembly G1, in order to eliminate the switching power loss of the gate turn-off thyristor. Accordingly, the all cathode layers can be maintained to be conductive, even when the load current decreases to the minimum value ia as is shown by a curve 11 of FIG. 3.

According to the gate controlled semiconductor device in FIGS. 1 and 2, the gate electrode is devided into two portions, and the firing current is supplied from the one of the devided gate electrode to the device, and, as a result, the sensitivity of the gate electrode increases, since the oppositing length of the cathode electrode to the gate electrodes is shortened. Consequently, the necessary gate current is decreased in the gate turn-off thyristor. Morefurther, it should also be evident that the high performance of the gate turn-off thyristor is obtained without decreasing the current capacity.

Figure 6:
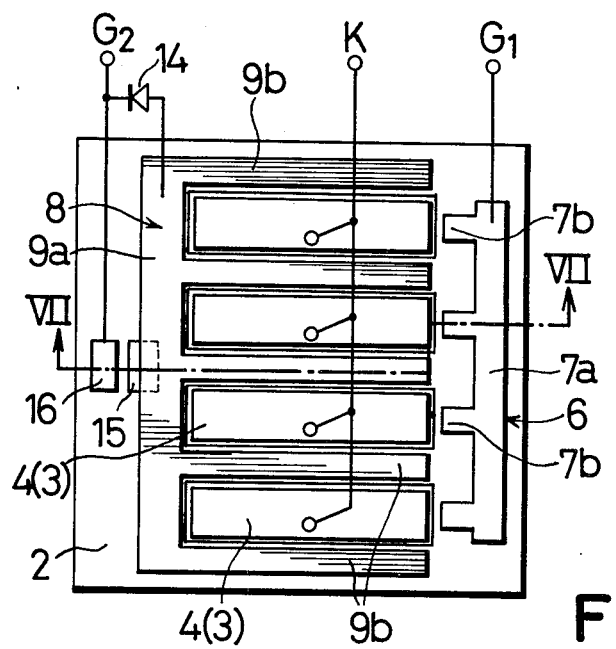
FIG. 6 is a plane view of another gate controlled semiconductor device embodying the present invention.
Figure 7:
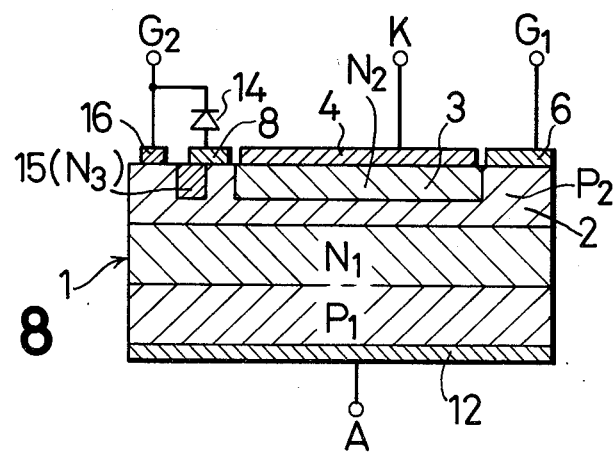
FIG. 7 is a plane view of the gate controlled semiconductor device taken along line VII—VII.

In FIGS. 6 and 7 is illustrated a gate turn-off thyristor which is also employed in the present invention. The gate turn-off thyristor includes a small area N3 layer 15 which is formed by diffusing N-type impurity on the surface of the P2 layer 2. The N3 layer 15 is arranged into the P2 layer 2 independently with respect to the N2 layer 2. A part of the surface of N3 layer 16 contacts with the metallic layer 8 of the second gate electrode assembly G2. A metallic layer 16 is provided, spaced from the N3 layer 15 on the surface of the P2 layer 2 at the opposite side to the first gate electrode assembly G1 with respect to the N2 layer 3. In this case, an auxirially thyristor is formed by the P1 layer, N1 layer, P2 layer 2 and the N3 layer 15.

As is shown in FIG. 6, the metallic layer 8 of the second gate electrode assembly G2 is connected to the metallic layer 16 via a diode 14. In the device shown in FIGS. 6 and 7, when the gate current is supplied to the cathode electrode assembly K in the forward biassing condition, the gate current branches to the metallic layer 6 and to the metallic layer 16. The current flowed from the metallic layer 6 makes a part of the cathode layer which is locating to the side of the metallic layer 6 to fire, and, at the same time, the current from the metallic layer 16 renders the small area auxiliary thyristor consisting of the P1N1P2N3 layers to the ON state. The current from the N3 layer 15 flows into the cathode N2 layer 3 by way of the second gate electrode assembly G2, and thereafter makes the cathode layer 3 to fire. In this case, the current from the metallic layer 16 is amplified by the auxiliary thyristor. Further, the gate turn-off thyristor shown in FIGS. 6 and 7, is also turned OFF by by sweeping the current individually from the gate electrode assemblies G$_1$ and G$_2$, and thereby the main current is turned OFF.

Further, for better understanding the present invention, the characteristics of the gate turn-off thyristor which has a field initiated function will be described with reference to FIGS. 8 and 9.

Figure 8:
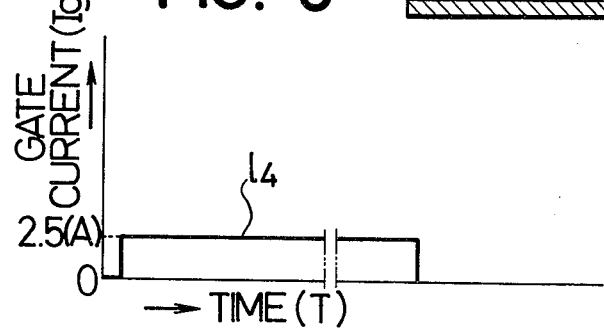
FIG. 8 is a graph illustrating a gate current characteristics of a connentional gate turn-off thyristor which has a gate current amplifying function.

FIG. 8 shows an example of the characteristics of a conventional gate turn-off thyristor having the field initiated function. In the conventional gate turn-off thyristor, a gate current of 2.5 amperes is required continuously to maintain the gate turn-off thyristor to be conductive, as is shown by a curve 14 of FIG. 8.

Figure 9:
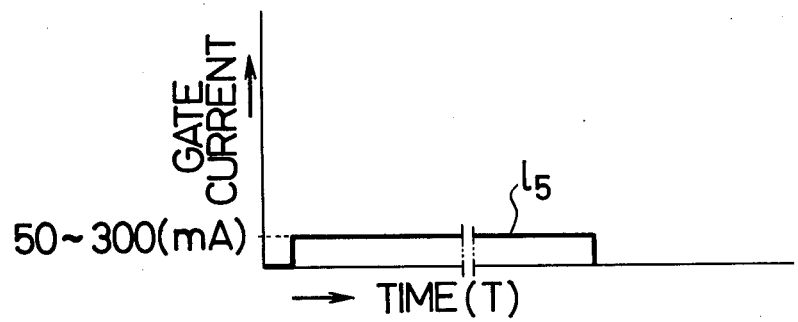
FIG. 9 is a graph illustrating a gate current characteristics of a gate controlled semiconductor device shown in FIGS. 6 and 7.

On the other hand, according to the gate turn-off thyristor shown in FIGS. 6 and 7, the extremely small gate current such as, for example, currents of 50-300 (mmA) is required to supply continuously in order to maintain the gate turn-off thyristor to be conductive state, as is shown by a curve 15 of FIG. 9. According to the present invention, therefore, a gate driver circuit becomes simple and small size in addition to inexpensive.

In case the first gate electrode assembly G1 and the second gate electrode assembly G2 are arranged arround the cathode-emitter layers, each of the first and second electrodes G1 and G2 as well as the cathode electrode assembly K become slender, and furthermore the distance between the cathode electrode K, the first gate electrode assembly G1 and the second gate electrode assembly G2 become usually 10-100 ($\mu$) and become maximumly 1 (mm) at most. When the distance between each electrode is small, the resistance value between the first gate electrode assembly G1 and the second gate electrode assembly G2 is approximately 0.5 ($\Omega$) and, therefore, the gate turn-on current of the first gate electrode assembly G1 is about $\frac{1}{2}$-$\frac{1}{4}$ with respect to the gate turn-on current of the second gate electrode assembly G2.

As is discussed above, since the gate turn-on current of the first gate electrode assembly G1 is considerably small, the conductive condition can be retained by supplying the small gate current to the first gate electrode assembly G1 in comparison with the conventional gate turn-off thyristor. With all the small gate current of the gate turn-off thyristor of the above embodiment, but it has not a sufficiently good effect comparing to the usual power thyristor.

Figure 10:
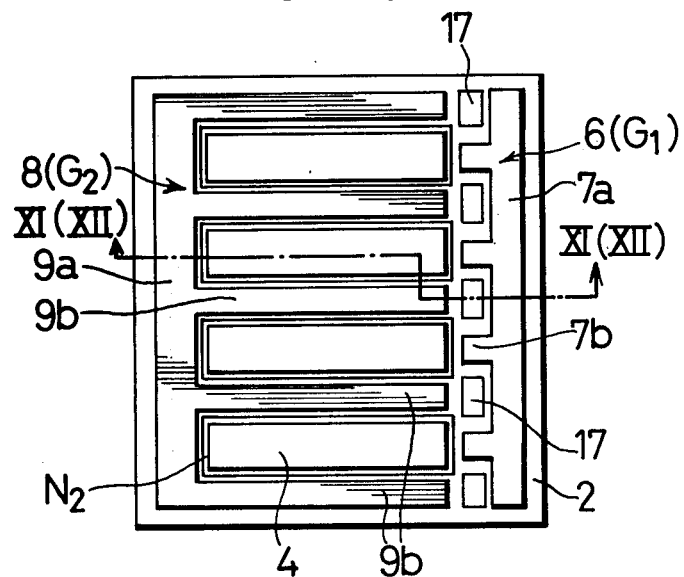
FIG. 10 is a plane view of another gate controlled semiconductor device embodying the present invention.

FIG. 10 shows a further embodiment of the present invention, which resolves the above various problems.

Referring to FIG. 10, a plurality of relatively narrow and long N2 layers 3 are formed on the surface of the P2 layer 2. Metallic layers 4 are mounted on each surface of the N2 layers 3, and a comb-shaped metallic layer 8 is mounted on the surface of the P2 layer 2. Other comb-shaped metallic layer 6 is mounted on the other side of the P2 layer 2, and the metallic layer 6 comprises a plurarity of projections 7b extending towards the edges of the metallic layer 3 of the cathode electrode assembly K. A plurality of resistor layers 17 are provided on the surface of P2 layer 2, each of which is spaced, localized between the projections 7b of the metallic layer 6 and the extension 9b of the metallic layer 8. The resistor layers 17 act to prevent the current flowing from the first gate electrode assembly G1 to the second gate electrode assembly G2, and thereby the separated cathode-type gate turn-off thyristor is formed.

Figure 11:
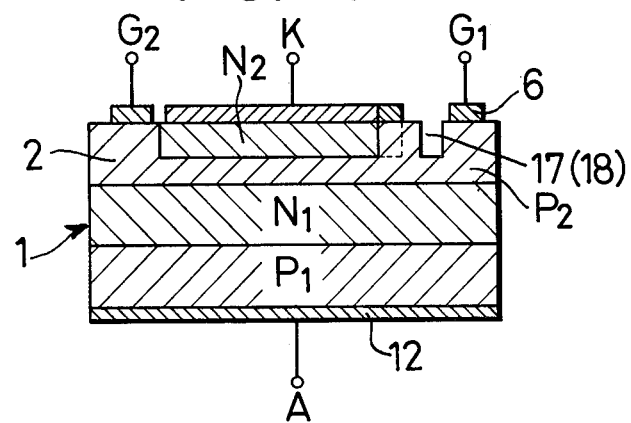
FIG. 11 is a vertical sectional view of a gate controlled semiconductor device taken along line XI—XI of FIG. 10.

FIG. 11 shows a modification of the gate turn-off thyristor of FIG. 10. In the gate turn-off thyristor shown in FIG. 11, a plurality of recesses 18 as the registor layers 17 is engraved in the surface of P2 layer 2 and located between a metallic layer 6 of the first gate electrode G1 and the extention 9b of the metallic layer 8 constituting the second gate electrode assembly G2. The recesses are easily formed by a conventional methode such as, for example, by a chemical etching method. By the presence of the recess, the resistor layer 17 is obtained between the first gate electrode assembly G1 and the second gate electrode assembly G2. The resistance value of the resistor layer 17 is, in general, preferable to set to 1.5-10($\Omega$).

Figure 12:
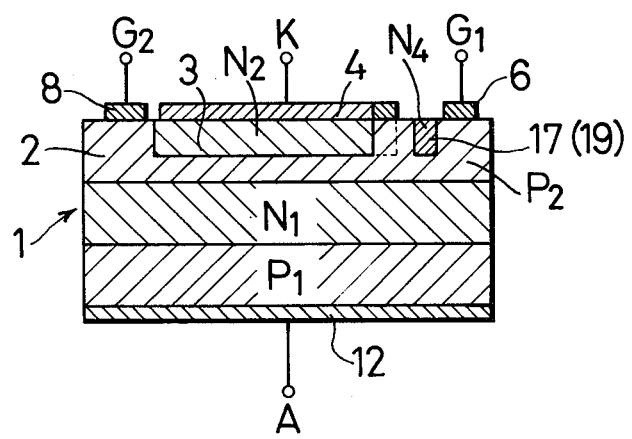
FIG. 12 is a vertical sectional view of a gate controlled semiconductor device taken along line XII—XII of FIG. 10.

FIG. 12 shows another modification of the gate turn-off thyristor of FIG. 10, and, in the gate turn-off thyristor, an insulating and separating layer 19 is provided in the surface of the P2 layer 2 as the registor layer 17.

The insulating and separating layer includes an N4 layer 19 which is made by diffusing heterogeneous conductive N-type impurity to the P2 layer 2.

According to the gate turn-off thyristors, shown in FIG. 12, the transverse resistance of the sillicon wafer is increased by forming the registor layer 17, and thereby the necessary gate turn-on current of the first gate electrode assembly G1 is reduced to about 1/5-1/20 in comparison with that of the second gate electrode assembly G2.

According to the gate turn-off thyristors illustrated in FIGS. 10 to 12, the transverse regitance is increased due to the presence of registor layers 17 (18, 19) which are formed in P-type layer and are located between the metallic layer 6 of the first gate electrode assembly G1 and the extensions 9b of the metallic layer 8 forming the second gate electrode assembly G2. By the increment of transverse regitance of the wafer, the gate current to be supplied from the first gate electrode assembly G1 is extremely decreased, and the power to be supplied in order to retains the semiconductive element 1 to conductive can be caused to small same degree as the required power in the usual thyristor, owing to the decrement of the gate current of the first gate electrode assembly G1.

As is explained with reference to the above various embodiments, in the gate controlled semiconductor device in accordance with the present invention, a gate electrode is substantially a plurality of gate electrode assemblies, and at least one gate electrode assembly for supplying the ON signal is provided so as to opposite to the cathode electrode.

Accordingly, it should be apparent that following advantages are obtained.

(1) An ON sensitivity of the device is extremely improved in comparison with the prior art device.

(2) It is easy to prevent the malfunction of the device by supplying continuously the small gate current from the first gate assembly in conducting interval thereof, even when a load circuit is unsteady due to an oscillatory load or the like.

(3) A good characteristic and economical gate turn-off thyristor can be obtained by dividing a gate electrode to exclusive gate electrodes using for turn-on and turn-off.

(4) Since the additional and mechanical parts is not required in addition to a conventional gate controlled semiconductor device, an inexpensive device is obtained without decreasing a yield.

(5) Since the decrement of the junction area is not necessary, a high performance device is obtained without decreasing the current capacity thereof.

Accordingly, it is to be understood that the embodiments described in detail are only illustrative of the general principles involved other embodiments may be devised consistent with the spirit and scope of the invention.

What is claimed is:

1. A gate turn-off thyristor comprising:
   a semiconductive element including at least two P-N junctions formed between a P-type diffused region and an N-type diffused region,
   an anode electrode,
   a cathode electrode including a plurality of divided cathode electrode assemblies including metallic layers on a cathode-emitter layer formed on a surface of said semiconductive element and a drain terminal electrode commonly connected to said metallic layers,
   and a gate electrode including a plurality of separated gate electrode assemblies on the surface of said semiconductive element and surrounding said cathode electrode,
   said plurality of gate electrode assemblies having a first gate electrode assembly for supplying an ON signal to said semiconductive element and opposite to said cathode electrode assembly, and a second gate electrode assembly for supplying ON and OFF signals to said semiconducitve element and provided in opposite side with respect to said first gate electrode assembly and opposite to said plurality of cathode electrode assemblies so that the facing length of the second gate electrode assembly to said plurality of cathode electrode assemblies is longer than the facing length of the first gate electrode assembly to said plurality of cathode electrode assemblies,
   said first and second gate electrode assemblies comprising respectively, a metallic layer arranged on a surface of said semiconductive element and opposite to said cathode electrode assembly,
   said metallic layer of said first gate electrode assembly comprising a bridging segment spaced from one end portion of said cathode electrode assembly and at least one projection extending from the bridging segment thereof,
   said metallic layer of said second gate electrode assembly comprising further a bridging segment spaced from the other end portion of said cathode assembly and at least one extension extending from the bridging segment along to said cathode electrode assembly and toward said projection of the first gate electrode assembly.

2. A gate turn-off thyristor as claimed in claim 1, further comprising an auxiliarly thyristor layer including an N-type layer diffused on the surface of the P-type layer of the semi-conductive element for contacting the metallic layer of said second gate electrode assembly and a metallic layer on said P-type layer and spaced from said N-type layer.

3. A gate turn-off thyristor as claimed in claim 1, further comprising a resistor layer formed in the P-type layer and located between a metallic layer of first gate electrode and an extension of metallic layer forming the second gate electrode assembly.

4. A gate turn-off thyristor as claimed in claim 1, wherein said resistor layer is a recess formed in the P-type layer and located between a metallic layer forming the second gate electrode assembly.

5. A gate turn-off thyristor as claimed in claim 3, wherein said resistor layer is a separating and N-type impurity layer formed in the P-type layer by diffusing an N-type impurity between a metallic layer of first gate electrode and the extension of metallic layer forming the second gate electrode.

* * * * *